(12) United States Patent
Misaka

(10) Patent No.: US 11,142,823 B2
(45) Date of Patent: Oct. 12, 2021

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventor: Shinichiro Misaka, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 286 days.

(21) Appl. No.: 16/313,268

(22) PCT Filed: May 30, 2017

(86) PCT No.: PCT/JP2017/019980
§ 371 (c)(1),
(2) Date: Dec. 26, 2018

(87) PCT Pub. No.: WO2018/003372
PCT Pub. Date: Jan. 4, 2018

(65) Prior Publication Data
US 2019/0153602 A1    May 23, 2019

(30) Foreign Application Priority Data

Jun. 27, 2016 (JP) .............................. JP2016-126300

(51) Int. Cl.
*C23C 16/46* (2006.01)
*H01L 21/027* (2006.01)
(Continued)

(52) U.S. Cl.
CPC ........ *C23C 16/463* (2013.01); *C23C 16/0209* (2013.01); *C23C 16/46* (2013.01); *H01L 21/027* (2013.01); *H01L 21/205* (2013.01); *H01L 21/67103* (2013.01); *H01L 21/67248* (2013.01); *H01L 21/67259* (2013.01); *H01L 21/68* (2013.01)

(58) Field of Classification Search
CPC ...................................................... C23C 16/463
See application file for complete search history.

(56) References Cited

FOREIGN PATENT DOCUMENTS

| JP | 2008-177303 A | 7/2008 | |
| JP | 2008177303 A * | 7/2008 | ........... C23C 14/541 |

(Continued)

OTHER PUBLICATIONS

International Search Report dated Aug. 29, 2017 for WO 2018/003372 A1.

*Primary Examiner* — Steven S Anderson, II
(74) *Attorney, Agent, or Firm* — Abelman, Frayne & Schwab

(57) ABSTRACT

A substrate processing apparatus that places a substrate on a placing portion and performs a heating processing on the substrate includes a plurality of heating control regions that are set plurally along a circumferential direction of the placing portion to heat the substrate placed on the placing portion, and are independently controlled in temperature, and an adjusting unit that adjusts a relative direction of a circumferential direction of the substrate with respect to an arrangement of the circumferential direction of the plurality of heating control regions based on information on deformation of the substrate different in height from a plane orthogonal to a center axis of the substrate in the circumferential direction.

8 Claims, 13 Drawing Sheets

(51) Int. Cl.
*H01L 21/205* (2006.01)
*C23C 16/02* (2006.01)
*H01L 21/68* (2006.01)
*H01L 21/67* (2006.01)

(56) References Cited

FOREIGN PATENT DOCUMENTS

| | | |
|---|---|---|
| JP | 4391518 B | 10/2009 |
| JP | 2013-046047 A | 3/2013 |
| JP | 2013-207030 A | 10/2013 |
| JP | 2013207030 A * | 10/2013 |

* cited by examiner

SUBSTRATE PROCESSING APPARATUS, SUBSTRATE PROCESSING METHOD, AND STORAGE MEDIUM

CROSS REFERENCE TO RELATED APPLICATIONS

This application is a national phase of PCT application No. PCT/JP2017/019980, filed on 30 May 2017, which claims priority from Japanese Patent Application No. 2016-126300, filed on 27 Jun. 2016, all of which are incorporated herein by reference.

TECHNICAL FIELD

The present disclosure relates to a technique of placing a substrate on a placing portion and performing a heating processing.

BACKGROUND

In a semiconductor manufacturing process, a coating film is formed on a substrate such as, for example, a semiconductor wafer (hereinafter, referred to as a "wafer"), and then the wafer is placed on a placing portion provided with a heater and a heating processing is performed. In order to improve uniformity of the heating processing in a wafer plane, it is desirable to align a distance between the wafer placed on the placing portion and a surface of the placing portion. Meanwhile, because of multilayering of memory cells, wafers may be deformed into a peculiar shape before performing a heating processing. The peculiar shape is not a shape of wafer deformed concentrically to a convex shape or a concave shape, but a shape of wafer different in height of a plane orthogonal to a center axis of the wafer in a circumferential direction such as, for example, a saddle-like shape. Due to further progress of lamination in the future, it is expected that the deformation amount (warping amount) of the wafer will become larger than that of the current wafer. Therefore, since the distance between the wafer and the surface of the placing portion does not become uniform during the heating processing, there is a concern that the in-plane uniformity of the wafer temperature will deteriorate.

A heating module that performs a heating processing is configured to divide the region of wafer to be heated into a plurality of regions, and provide heaters in each divided region so as to independently control each heater to generate heat. As a method of adjusting parameters of a control system of the heater, as disclosed in Patent Document 1, a method is known in which, when a temperature of a placing table (hot plate) is measured at a plurality of measuring points, each measured point coincides with each target temperature. However, in a case where the distance between the wafer and the surface of the placing table is different in the circumferential direction, for example, when a portion having a relatively large distance between the surface of the placing table and the wafer is placed on a boundary between the plurality of divided regions, even if the heater is controlled, the heat of the heater is difficult to be transferred to the wafer so that the heat is hardly reflected to the wafer temperature. Therefore, in order to perform a heating processing with good in-plane uniformity, further improvement is required.

PRIOR ART DOCUMENT

Patent Document

Patent Document 1: Japanese Patent No. 4391518

SUMMARY OF THE INVENTION

Problems to be Solved

The present disclosure has been made in view of these circumstances. The present disclosure is to provide a technique capable of improving uniformity of a heating processing in a plane of a substrate.

Means to Solve the Problems

Therefore, in a substrate processing apparatus of the present disclosure, the substrate processing apparatus that places a substrate on a placing portion and performs a heating processing on the substrate, includes:

heating control regions that are set plurally along a circumferential direction of the placing portion to heat the substrate placed on the placing portion, and are independently controlled in temperature, and an adjusting unit that adjusts a relative orientation of a circumferential direction of the substrate with respect to an arrangement of the circumferential direction of the plurality of heating control regions based on information on deformation of a substrate different in height from a plane orthogonal to a center axis of the substrate in the circumferential direction.

Further, a substrate processing method of the present disclosure includes:

detecting deformation of a substrate different in height from a plane orthogonal to a center axis of the substrate in a circumferential direction, adjusting a relative orientation of a circumferential direction of the substrate with respect to an arrangement of a circumferential direction of a plurality of heating control regions, by using the heating control regions that are set plurally along a circumferential direction of a placing portion to heat the substrate placed on the placing portion, and are independently controlled in temperature, based on the detection result obtained in the processing for detecting deformation of the substrate, and heating the substrate in a state where the relative orientation of the circumferential direction of the substrate is adjusted.

Further, a storage medium of the present disclosure is a non-transitory computer-readable storage medium that stores a computer program that is used for a substrate processing apparatus that places a substrate on a placing portion and performs a heating processing on the substrate, and the computer program includes a step group organized to, when executed, cause a computer to execute the substrate processing method of the present disclosure.

Effect of the Invention

In the present disclosure, a substrate is placed on a placing portion having a plurality of heating control regions that are set plurally along a circumferential direction of the placing portion and are independently controlled in temperature, and a heating processing is performed on the substrate. A relative orientation of the circumferential direction of the substrate with respect to an arrangement of the circumferential direction of the plurality of heating control regions is adjusted based on a detection result of deformation of the substrate. Therefore, even when the substrate is deformed to be different in height with respect to the plane orthogonal to the center axis thereof in the circumferential direction, a region in the substrate having a large amount of deformation is suppressed from being placed on the boundary between the plurality of heating control regions. As a result, the temperature control in the heating control regions is easily reflected to the substrate temperature, so that the uniformity of the heating processing in a plane of the substrate may be improved.

DETAILED DESCRIPTION TO EXECUTE THE INVENTION

First Embodiment

Figure 1A:
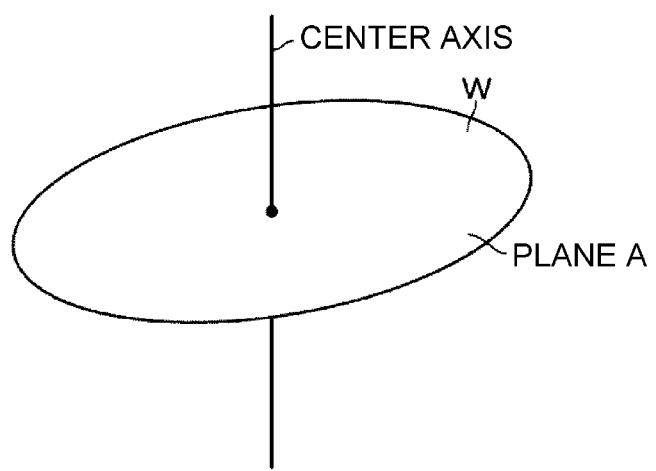
FIGS. 1A and 1B are perspective views illustrating an example of deformation of a substrate.
Figure 1B:
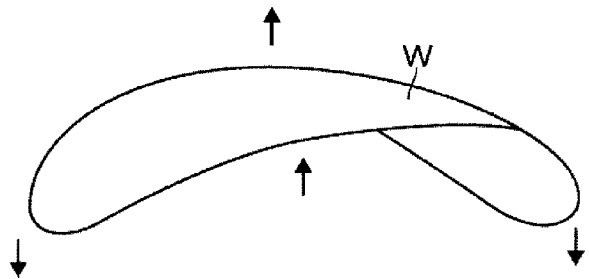

A first embodiment of a substrate processing apparatus of the present disclosure will be described with reference to FIGS. 1A to 10. As illustrated in FIGS. 1A and 1B, a wafer W, which is an object to be subjected to a substrate processing of the present disclosure, is deformed into a shape different in height with respect to a plane orthogonal to a center axis of the wafer W in a circumferential direction. FIG. 1A illustrates a wafer W without deformation (no warping), and for example, a surface of the wafer W is a horizontal plane A orthogonal to a center axis C of the wafer W. FIG. 1B illustrates an example of deformation, and for example, illustrates a state where a region with a low height with respect to the horizontal plane A and a region with a high height with respect to the horizontal plane A are alternately arranged in the circumferential direction, in other words, a state where the wafer W is deformed into a saddle-like shape. Due to multi-layered memory cells, there are increasing trends in which the wafer W is deformed into the saddle-like shape before a heating processing.

Figure 2:
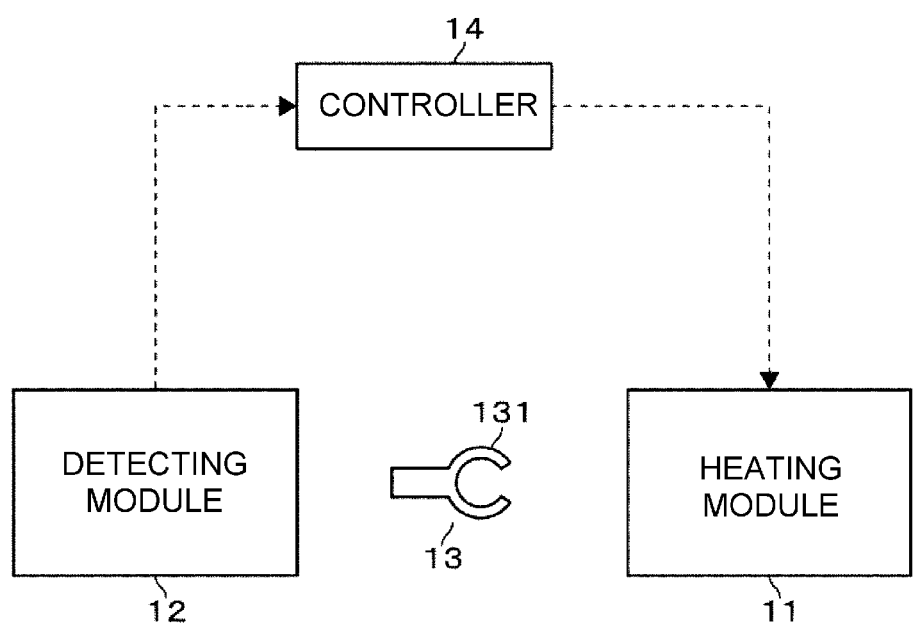
FIG. 2 is a configuration view illustrating a first embodiment of a substrate processing apparatus.

As illustrated in FIG. 2, a substrate processing apparatus 1 of the present disclosure includes a heating module 11 that places the wafer W on a placing portion and performs a heating processing, a detecting module 12, a conveying mechanism 13 that conveys the wafer W between the detecting module 12 and the heating module 11, and a controller 14. The detecting module 12 in this example also serves as an adjusting unit (to be described later), and a detecting unit configured to detect deformation of the circumferential direction of the wafer W. Further, in this example, the detecting unit corresponds to an aspect of a deformation information acquiring unit that acquires information on deformation of the substrate.

In the conveying mechanism 13, for example, a holding member 131 that holds a back side of the wafer W is configured to be movable in up and down, back and forth, and horizontal directions.

Figure 3:
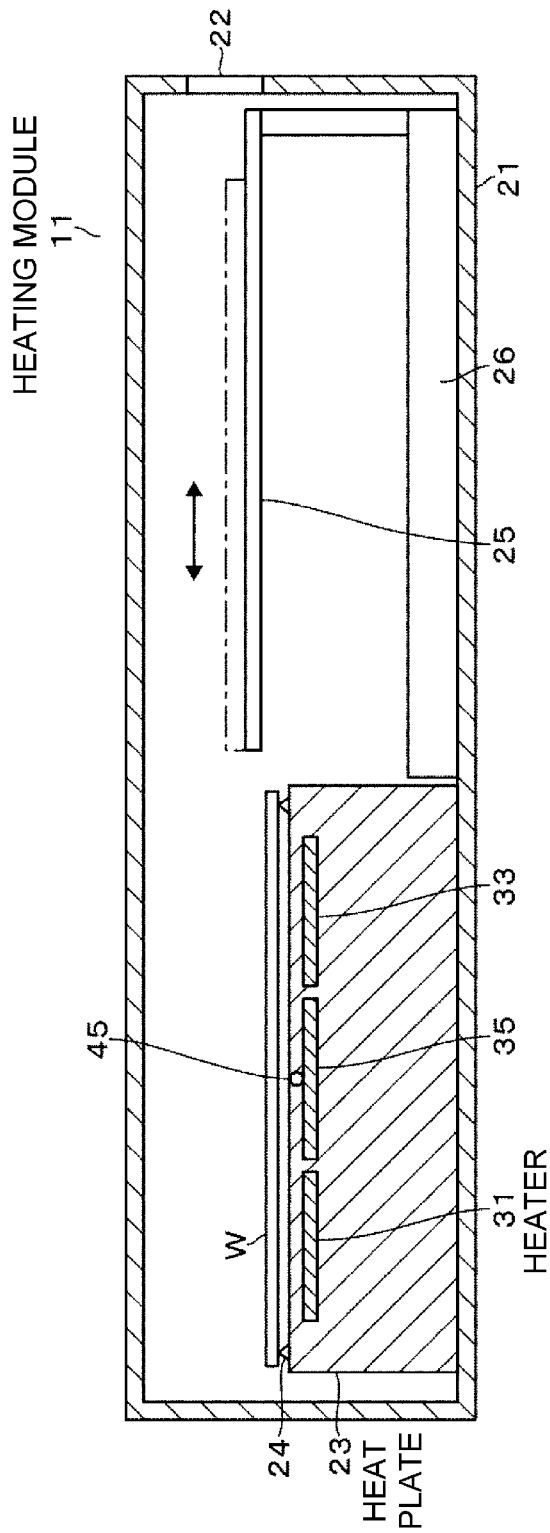
FIG. 3 is a vertical-sectional side view illustrating a heating module provided in the substrate processing apparatus.

FIG. 3 is a vertical-sectional side view illustrating an example of the heating module 11. The heating module 11 includes a case 21, and in the drawing, reference numeral 22 denotes a conveying port of the wafer W provided in the case 21. In the drawing, reference numeral 23 denotes a horizontal heat plate in which the surface thereof is heated. The heat plate also serves as a placing portion of the wafer W. In the drawing, reference numeral 24 denotes a plurality of support pins provided on the surface of the heat plate 23. The wafer W is placed on the support pins 24 and is heated in a state of slightly floating from the surface of the heat plate 23.

In the drawing, reference numeral 25 denotes a cooling plate that places and cools the wafer W after heating. The cooling plate moves horizontally between a standby position which is outside the hot plate 23 illustrated in FIG. 3 and a position above the heat plate 23 by a moving mechanism 26, and mediates delivery of the conveying mechanism 13 and the heat plate 23. Specifically, the conveying mechanism 13 elevates with respect to the cooling plate 25 in the standby position illustrated in FIG. 3, and then the wafer W is delivered between the conveying mechanism 13 and the cooling plate 25. Further, when the cooling plate 24 moves to an upper side of the heat plate 23, the wafer W is delivered between the cooling plate 24 and the heat plate 23 through cooperation of elevating of an elevation pin (not illustrated) provided in the heat plate 23 and the movement of the cooling plate 25.

Figure 4:
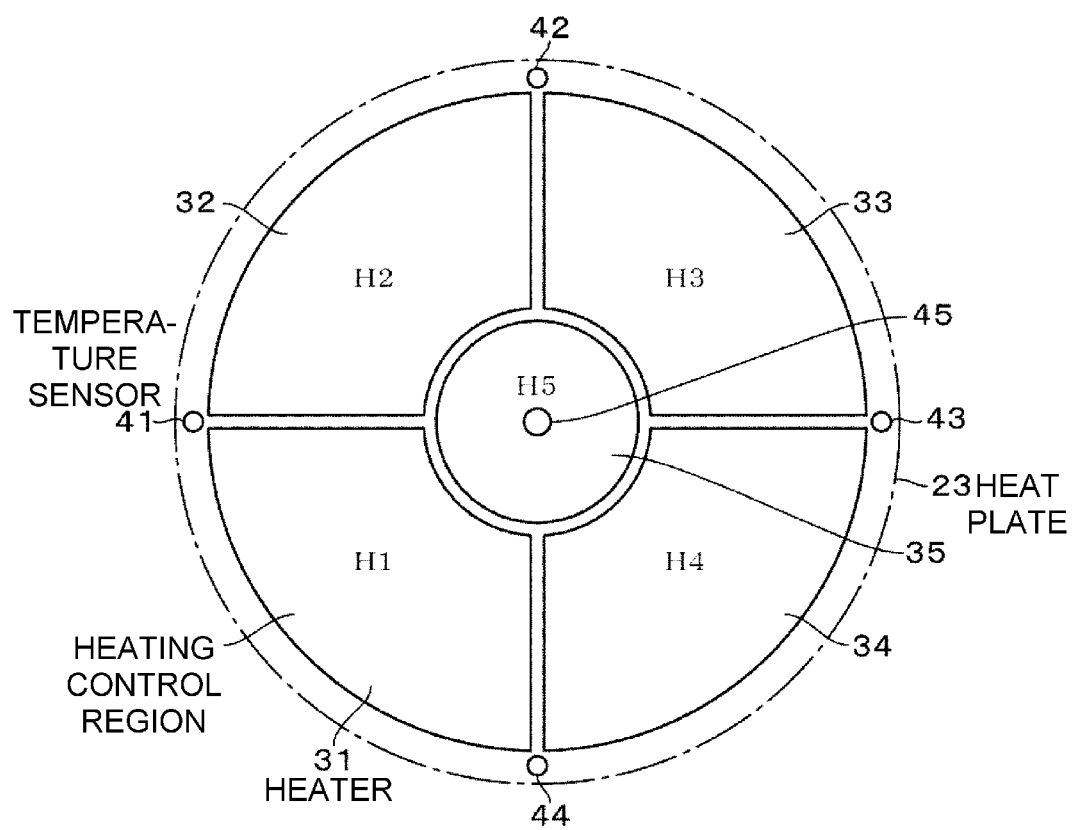
FIG. 4 is a plan view illustrating a heat plate provided in the heating module.

The heat plate 23 will be described in more detail with reference to the plan view of FIG. 4. Heaters 31 to 35 are buried respectively in regions of the heat plate 23 different from each other when viewed in a plan view. FIG. 4 illustrates a configuration in which the heaters 31 to 35 are provided respectively in five regions, and each of the regions in which each of the heaters 31 to 35 is provided corresponds to heating control regions H1 to H5. In other words, the surface of the heat plate 23 is set to be divided into five heating control regions H1 to H5, the heaters 31 to 35 are provided in each of the heating control regions H1 to H5, and a temperature of each of the heating control regions H1 to H5 is controlled independently from each other. The heaters 31 to 35 are illustrated as the same size to the size of the heating control regions H1 to H5 for convenience of illustration.

In the example, four regions along the circumferential direction of the heat plate 23 are allocated to the heating control regions H1 to H4, respectively, and a center region of the heat plate 23 is allocated to the heating control region H5. For example, the four heating control regions H1 to H4 in the circumferential direction are set such that circumferential lengths are aligned with each other. Further, temperature sensors 41 to 45 that detect temperatures of the heaters 31 to 35 and then output detecting signals are provided in the heat plate 23 for each of the above heating control regions H1 to H5.

Subsequently, descriptions will be made on an example of the detecting module 12 with reference to FIG. 5. The detecting module 12 in the example also serves as an adjusting unit and a detecting unit as described above. The adjusting unit adjusts an orientation of the circumferential direction of the wafer W with respect to the arrangement of the circumferential direction of the plurality of heating control regions H1 to H4, based on the detection result of the deformation of the wafer W. The detecting module 12 includes a case 51, and in the drawing, reference numeral 52 denotes a conveying port of the wafer W provided in the case 51. In the drawing, reference numeral 53 denotes, for example, a horizontal holding portion that holds a back side of the back side center portion of the wafer W. For example, the horizontal holding portion is formed to be smaller than the wafer W in a plan view.

The holding portion 53 is connected to a rotating mechanism 54 via a rotating shaft 541, and is configured to be rotatable around a vertical axis while holding the wafer W. The holding portion 53 and the rotating mechanism 54 are mechanisms that adjust the orientation of the wafer W based on the detection result of the deformation of the wafer W, before placing the wafer W on the heat plate (placing portion) 23 of the heating module 11. In the example, a plurality of support pins 531 are provided on the surface of the holding portion 53, the wafer W is held in a state of being displaced on the support pins 531, and the wafer W is delivered between the holding portion 53 and the conveying mechanism 13 through cooperation of elevating of the holding portion 53 and the movement of the conveying mechanism 13. Further, the holding portion 53 may be configured with, for example, a spin chuck that directly displaces the wafer W on the surface of the holding portion 53 and then absorbs and holds, without providing the support pins 531.

In the detecting module 12, the detecting of the deformation of the circumferential direction of the wafer W is performed by, for example, measuring the distance to the wafer W in the direction orthogonal to the wafer W along the circumferential direction of the wafer W. The detecting module 12 constitutes a distance measuring unit. Therefore, the detecting module 12 includes a distance sensor 55 that is constituted by a laser displacement meter that detects a distance to an object to be measured using laser light, and is configured to output the laser light to a back side peripheral portion of the wafer W held by the holding portion 53. Then, by measuring a distance to the wafer F by the distance sensor 55 while rotating the holding portion 53 that is holding the wafer W, a distance L between the distance sensor 55 and the wafer W in the direction orthogonal to the wafer W is measured along the circumferential direction of the wafer W.

Thus, in the detecting module 12, a measurement result of the distance in the circumferential direction in the peripheral portion region of the wafer W is acquired as a detection result of the deformation, and the orientation of the circumferential direction of the wafer W with respect to the arrangement of the circumferential direction of the plurality of heating control regions H1 to H4 in the heating module 11 is adjusted based on the detection result. Specifically, the detection result of the deformation by the distance sensor 55 is output to the controller 14, and the controller 14 outputs, based on the detection result, a control signal to adjust the orientation of the circumferential direction of the wafer W, and a control signal to adjust the temperature of each of the heaters 31 to 35 in the heating control regions H1 to H5.

The controller 14 includes a CPU 62, a memory (storage unit) 63, an input unit 64, an orientation adjusting unit 65, and a temperature adjusting unit 66 which are respectively connected to a bus 61. Further, the distance sensor 55 and the temperature sensors 41 to 45 are connected to the bus 61, respectively. Various calculations for executing a flow of a step of a heat processing (to be described later) are carried out by the CPU 62. The input unit 64 is constituted by a mouse, a keyboard, or a touch panel, and is provided such that a user of the apparatus performs various operations to proceed the flow of the step of the heat processing. The orientation adjusting unit 65, and the temperature adjusting unit 66 are constituted by, for example computer programs, respectively, and a group of stages is made to carry out a flow (to be described later). The programs are installed in the controller 14 from a storage medium such as a hard disk, a compact disk, a magneto-optical disk, a memory card, and a flexible disk.

Figure 7:
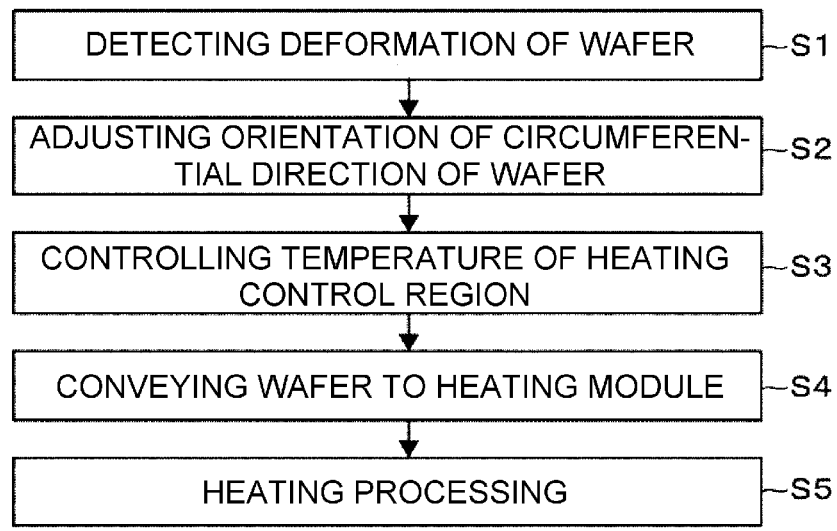
FIG. 7 is a flow chart illustrating a substrate processing method of the first embodiment.
Figure 8:
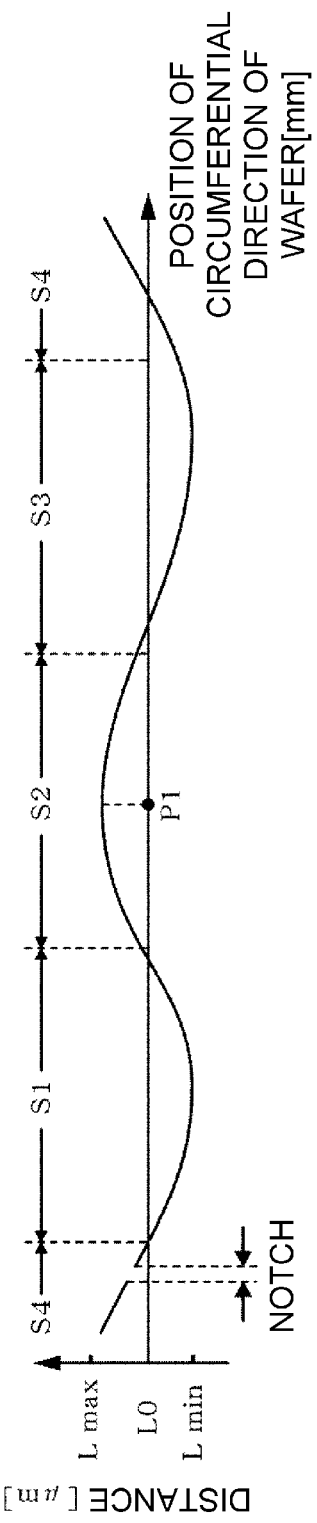
FIG. 8 is a characteristic view illustrating a relationship between a distance and a position of a circumferential direction of the substrate.

Subsequently, the heating processing of the wafer W will be described with reference to a flow chart of FIG. 7. First, the wafer W is carried into the detecting module 12 and placed on the holding portion 53. Subsequently, the distance L to the wafer W in the direction orthogonal to the wafer W is measured along the circumferential direction of the wafer W by the distance sensor 55 while rotating the holding portion 53, deformation of the wafer W and a position (position of a notch N) of the wafer W are detected, and the detection result is output to the controller 14 (stages S1). FIG. 8 schematically illustrates the detection result of the deformation of the wafer W. The horizontal axis illustrates the position of the circumferential direction of the wafer W, and the vertical axis illustrates the distance L to the wafer W as the deformation amount.

In FIG. 8, L0 on the vertical axis is a distance to a horizontal plane A (see, e.g., FIG. 1, a surface of the wafer without warping), a distance larger than the distance L0 indicates a state where the wafer is warped upward in a direction away from the heat plate 23, and Lmax is a maximum deformation amount (warping amount) when the wafer is warped upward. Further, a distance smaller than the distance L0 indicates a state where the wafer is warped downward in a direction approaching the heat plate 23, and Lmin is a maximum deformation amount when the wafer is warped downward. Further, since the laser light is not reflected by the wafer W at the notch position, the waveform is interrupted and the notch position is grasped by the position where the waveform is interrupted. Hereinafter, description will be continued taking an example in which the maximum value of the deformation amount of the wafer W is Lmax.

Based on the detection result, the controller 14 outputs a control signal for adjusting the orientation of the circumferential direction of the wafer W to the detecting module 12 as the orientation adjusting unit 65 (stage S2), and outputs a control signal for adjusting a temperature of each of the heaters 31 to 35 in each of the heating control regions H1 to H5 to the heating module 11 as the temperature adjusting unit 66 (stage S3). The orientation adjusting unit 65 adjusts the orientation of the wafer W such that, for example, the portion where the deformation of the wafer is maximum is not arranged in the boundary between the adjacent heating control regions H1 to H4 in the circumferential direction.

Figure 9A:
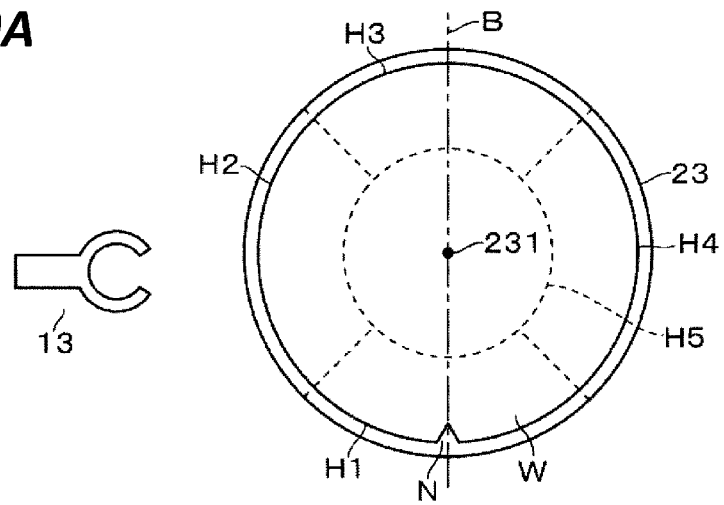
FIGS. 9A to 9C are schematic plan views describing an operation of the present disclosure.
Figure 9B:
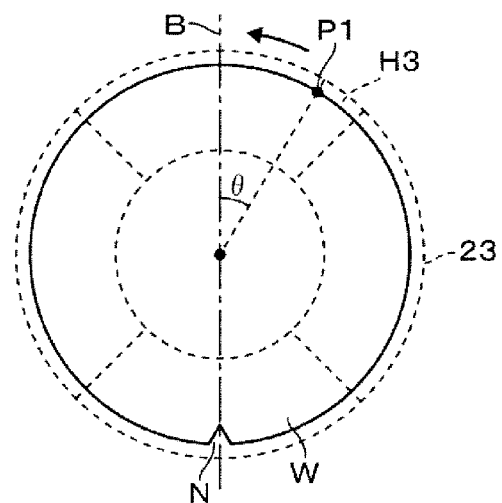

The wafer W whose deformation is detected by the detecting module 12 is conveyed to the heating module 11 by the conveying mechanism 13. However, as illustrated in FIG. 9A, for the wafer W without warping, for example, the wafer W is delivered to the heat plate 23 such that a center line B and the position of the notch N are aligned with each other. The center line B of the heat plate 23 is, for example, a line connecting a center position of the circumferential direction of any heating control region (in this example, H1) and a center 231 of the heat plate 23.

Meanwhile, for the warped wafer W, based on the detection result illustrated in FIG. 8, the adjustment of the orientation is performed by the detecting module 12 such that a position P1 where the deformation amount is the maximum does not reach the boundary portion between the heating control regions. In this example, the position P1 in the circumferential direction is rotated by the rotating mechanism 54 to a counterclockwise direction by an angle (θ), for example, to be aligned with the center line B (see, e.g., FIG. 9B). Thus, as will be described later, the wafer W after the adjustment of the orientation is delivered such that the position P1 in the circumferential direction is, for example, aligned with the center of the circumferential direction of the heating control region H3, on the heat plate 23 of the heating module 11 by the conveying mechanism 13 (see, e.g., FIG. 9C).

Figure 10:
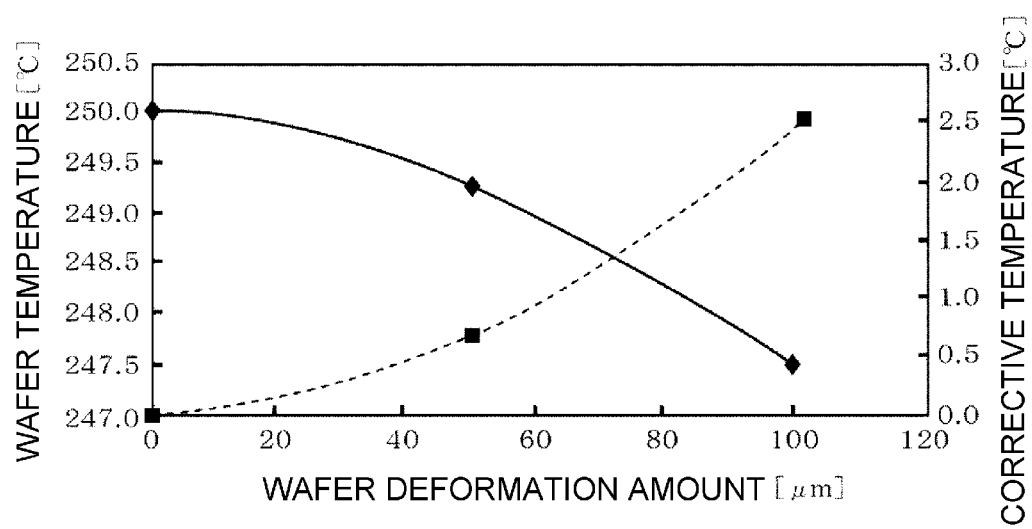
FIG. 10 is a characteristic view illustrating a relationship among a warping amount (deformation amount) of a wafer, a wafer temperature, and a correction temperature.

Meanwhile, for example, for the heating control region H3, the temperature adjusting unit 66 performs a temperature control by acquiring a correction temperature based on the deformation amount of the wafer W. FIG. 10 illustrates an example of a relationship between the warping amount (deformation amount) of the wafer W and a wafer temperature during the heat processing. A horizontal axis illustrates the warping amount of the wafer W, a left side vertical axis illustrates the wafer temperature during the heat processing, a right side vertical axis illustrates the correction temperature, ♦ illustrates plots of the wafer temperature, and ■ illustrates plots of the correction temperature. In FIG. 10, in a case where the wafer is warped upward in a direction away from the heat plate 23, the warping amount of the wafer W is a difference in distance from the wafer surface (the horizontal plane A in FIG. 1A) when the wafer without warping is placed on the heat plate 23. That is, in FIG. 8, the warping amount is a difference between the distance L of the mountain-like portion of the waveform and the distance L0, and in FIG. 10, the warping amount 100 μm indicates that the wafer is warped upward by 100 μm from the wafer W without warping.

When the wafer W warps upward, the wafer W is away from the heat plate 23, therefore, the heat is difficult to be transferred from the heat plate 23. When the temperature of the heat plate 23 is the same, the temperature of the wafer W becomes lower than a case where the wafer W does not warp. The present inventors has grasped that there is a correlation between the warping amount of the wafer W and the wafer temperature during the heating processing. By acquiring the correlation in advance, the wafer temperature during the heating processing is obtained from the warping amount of the wafer W, and the correction temperature is obtained based on the wafer temperature. Correlation date between the wafer warping amount and the correction temperature is obtained by performing an evaluation test in advance.

An example of the temperature control will be described with reference to FIG. 10. For example, assuming that the wafer temperature while the warping amount is 0 is a target temperature (250° C.), since the wafer temperature while the warping amount is 100 μm is 247.5° C., a temperature 2.5° C. that corresponds to the difference from the target temperature is taken as the correction temperature. Then, in order to raise the wafer temperature by the correction temperature, the correction temperature is added to a set temperature of the heater 33, and then, the temperature control of the heating control region H3 is performed. Further, the heaters 31 to 35 in each of the heating control regions H1 to H5 are controlled to be the set temperature based on the detected values of the temperature sensors 41 to 45. Therefore, with respect to the heating control region H3, the temperature control of the heater 33 is performed by regulating the correction value of the temperature based on the detected value of the temperature sensor 43 with the correction temperature obtained from the warping amount. Meanwhile, with respect to the heating control regions H1, H2, H4, and H5, for example, the temperature control is performed such that the heaters 31, 32, 34, and 35 are to be the set temperature based on the detected value of the temperature sensors 41, 42, 44, and 45.

Figure 9C:
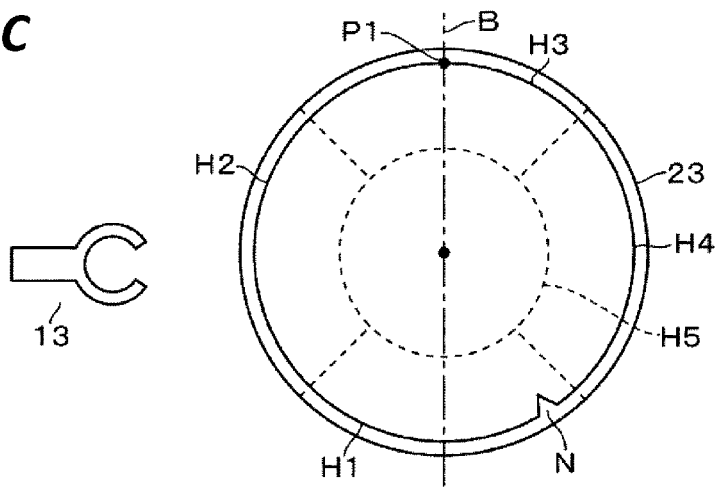

Subsequently, the wafer W whose orientation is adjusted in the detecting module 12 is conveyed to the heating module 11 by the conveying module 13, and delivered to the heat plate 23 (stage S4). Therefore, as illustrated in FIG. 9C, the wafer W is arranged on the heat plate 23 such that the position P1 in the circumferential direction is aligned with the center line B of the heat plate 23. And then, for example, the heat processing of the wafer W is started in a state where the temperature control of each of the heating control regions H1 to H5 is completed (stage S5). Be doing so, the wafer W on which the heat processing is performed for a predetermined time is delivered to the conveying mechanism 13 via the cooling plate 25, and conveyed from the heating module 11 to another module (not illustrated).

According to the above embodiment, based on the detection result of the deformation of the wafer W, the orientation of the circumferential direction of the wafer W with respect to the arrangement of the circumferential direction of the heating control regions H1 to H4 in the heat plate 23 is adjusted by rotating the wafer W. Therefore, even if the wafer W is deformed in a peculiar shape so that the height of the wafer W with respect to the plane orthogonal to the center axis is different in the circumferential direction, the region in the wafer W where the deformation amount is large is suppressed from being placed on the boundary between the plurality of heating control regions H1 to H4. Therefore, the uniformity of the heating processing in the plane of the wafer may be improved.

That is, since the heaters 31 to 34 are not buried at the boundary between the heating control regions, the heat transfer to the wafer is difficult as compared with the region where the heaters are buried. Therefore, when the portion of the wafer W where the deformation amount is large is arranged at the boundary between the heating control regions, the temperature of the portion in the wafer becomes lower than other regions, and the in-plane uniformity of the wafer temperature deteriorates. Therefore, when the portion where the deformation amount is large is arranged at a position away from the boundary between the heating control regions as in the present disclosure, the temperature control of the heating control regions is easily reflected to the wafer temperature, and thus, the uniformity of the heating processing in the plane of the wafer may be improved. Further, as described above, when the position P1 of the wafer where the deformation amount is large is arranged in a center region of the circumferential direction of the heating control region H3, and the temperature control of the heating control region H3 is performed based on the deformation amount of the wafer W, an appropriate heating control may be performed according to the deformation amount of the wafer W. Therefore, excellent uniformity of the heating processing is secured in the plane of the wafer accordingly.

In the above description, although the case where the maximum deformation amount of the wafer W is Lmax has been described as an example, since the wafer W is placed on the support pin 24, there may be a case where the wafer warps downward in a direction approaching to the heat plate 23. For example, according to the detection result of FIG. 8, description will be made on a case where the maximum deformation amount of the wafer W is Lmin. In this case, since the wafer approaches to the heat plate 23 more than the wafer W without warping, the heat is easily transferred from the heat plate 23. When the temperature of the heat plate 23 is the same, the temperature of the wafer W becomes higher than a case where the wafer W does not warp. Therefore, the wafer temperature is obtained from the deformation amount of the wafer W, based on the correlation between the wafer temperature during the heat processing and the deformation amount of the wafer W acquired in advance, and, the difference temperature between the wafer temperature and a target temperature of the wafer W, which serves as a correction temperature, is subtracted from, for example, the set temperature of the heater 33, and then the temperature control is performed.

Further, when the wafer W is deformed into a saddle-like shape, a portion lowered from a horizontal plane and a portion raised from the horizontal plane appear alternately as illustrated in FIG. 8, and there are many cases where the lowered portion and the raised portion are respectively positioned in a region where the wafer W is divided into four in the circumferential direction. Therefore, for example, the orientation of the wafer W is adjusted such that the position P1 of the maximum deformation amount is aligned with the center line B, and the wafer W is divided into four peripheral portion regions S1 to S4 so as to correspond to the heating control regions H1 to H4. Then, the temperature of each of the heating control regions H1 to H4 may be controlled based on the deformation amount (warping amount) of the peripheral portion regions S1 to S4 of the wafer W. For example, with respect to each of the peripheral portion regions S1 to S4 of the wafer W, the temperature control of the heating control regions H1 to H4 is performed by obtaining the maximum value of the deformation amount, acquiring a correction temperature based on the maximum value of the deformation amount, and regulating the set temperature of the heaters 31 to 34 with the correction temperature. In this case, for a wide range of the wafer W, the temperature of the heating control regions H1 to H4 is controlled according to the deformation amount, and thus, even more excellent in-plane uniformity is secured for the wafer temperature during the heat processing.

However, the temperature of the heating control region is not necessarily controlled based on the deformation amount of the corresponding wafer W. For example, when the wafer W is deformed into a saddle-like shape, as previously described, since a portion lowered from a horizontal plane and a portion raised from the horizontal plane alternately appear, the deformation of the wafer W is evaluated in advance, and a first heating control region whose temperature is controlled to be higher than the set temperature and a second heating control region whose temperature is controlled to be lower than the set temperature are alternately set. Then, based on the detection result of the deformation of the wafer W, the orientation of the wafer W may be adjusted in the detecting module such that a peripheral region of the wafer W deformed upward corresponds to the first heating control region, and a peripheral region of the wafer W deformed downward corresponds to the second heating control region.

Second Embodiment

Figure 11:
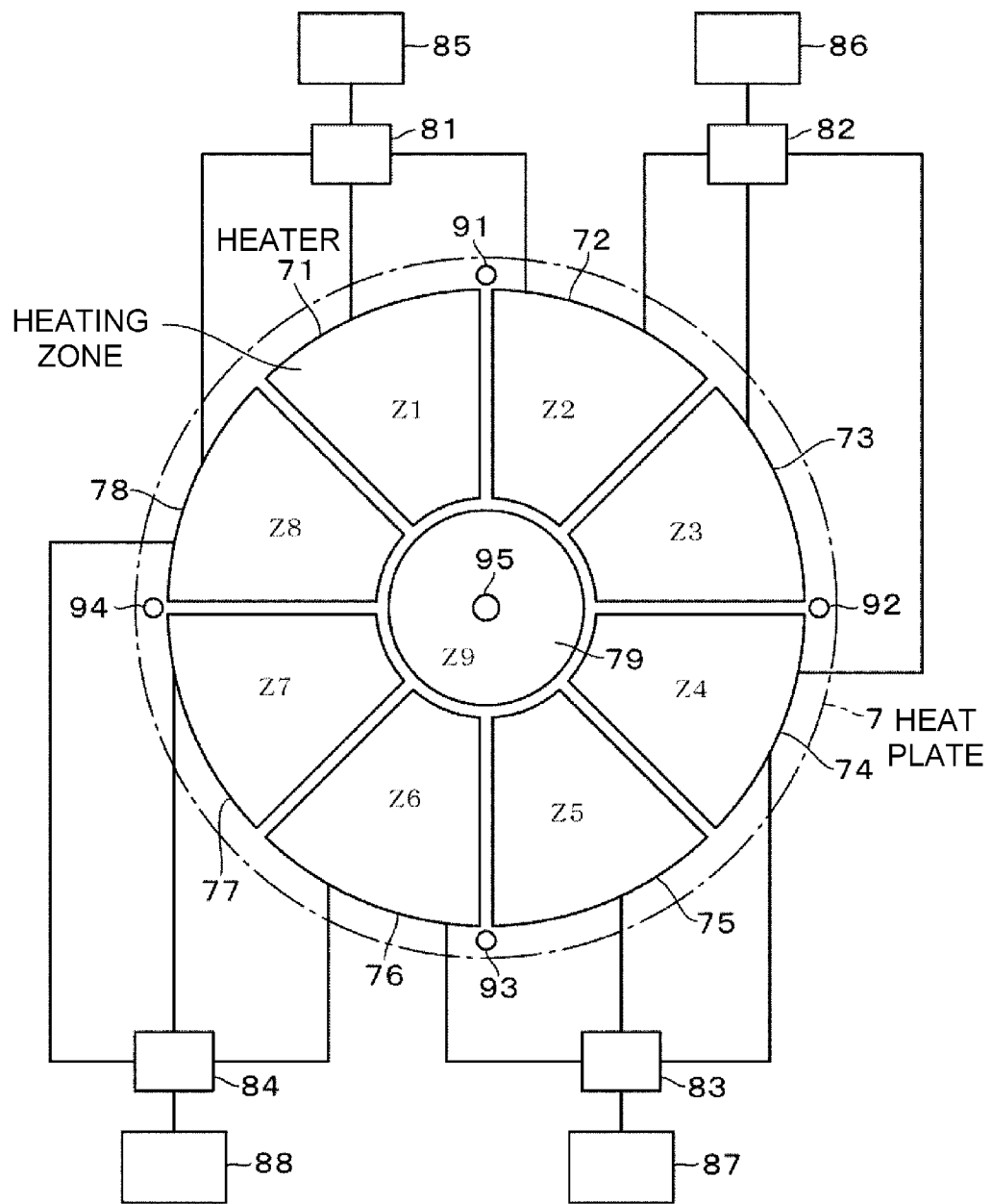
FIG. 11 is a plan view illustrating a heat plate of a second embodiment of the substrate processing apparatus.

Subsequently, a second embodiment of the substrate processing apparatus of the present disclosure will be described with reference to FIGS. 11 to 13. The embodiment is different from the first embodiment in that the adjustment is performed on the arrangement of the heating control regions instead of the orientation of the wafer W, based on the detection result of the deformation of the wafer W. Therefore, the adjusting unit is constituted by a mechanism that adjusts the arrangement of the circumferential direction of the heating control region. In a heat plate 7 of the heating module 11 in this example, as illustrated in FIG. 11, heaters 71 to 79 forming a heating mechanism respectively are buried in different regions when viewed in a plan view. FIG. 11 illustrates a configuration in which the heaters 71 to 79 are provided respectively in nine regions, and each of the regions in which each of the heaters 71 to 79 is provided corresponds to heating zones Z1 to Z9, respectively. Thus, the heat plate 7 is divided into nine heating zone Z1 to Z9, and each of the heating zone Z1 to Z9 is configured to be independently controlled in temperature by the heaters 71 to 79. The heaters 71 to 79 are illustrated as the same size to the size of the heating zones Z1 to Z9 for convenience of illustration.

In the example, eight regions along the circumferential direction of the heat plate 7 are allocated to the heating zones Z1 to Z8, respectively, and a center region is allocated to the heating zone Z9. For example, the eight heating zones Z1 to Z8 in the circumferential direction are set such that circumferential lengths are aligned with each other. Further, the heating module 11 includes a switch unit that selects a combination of heaters among the plurality of heaters. In this example, for example, a switch unit 81 that selects combinations (71 and 72) and (71 and 78) of two adjacent heaters among three heaters 71, 72, and 78 adjacent each other, and a switch unit 82 that selects combinations (72 and 73) and (73 and 74) of two adjacent heaters among three heaters 72, 73, and 74 adjacent each other are provided. Further, a switch unit 83 that selects combinations (74 and 75) and (75 and 76) of two adjacent heaters among three heaters 74, 75, and 76 adjacent each other, and a switch unit 84 that selects combinations (76 and 77) and (77 and 78) of two adjacent heaters among three heaters 76, 77, and 78 adjacent each other are provided. Reference numerals 85, 86, 87, and 88 are power supply units, respectively.

These switch units 81 to 84 are configured to switch between a first combination and a second combination according to a control signal from the controller 14. The first combination selects a combination of heaters (71 and 78), heaters (72 and 73), heaters (74 and 75), and heaters (76 and 77), and the second combination selects a combination of heaters (71 and 72), heaters (73 and 74), heaters (75 and 76), and heaters (77 and 78).

Figure 12A:
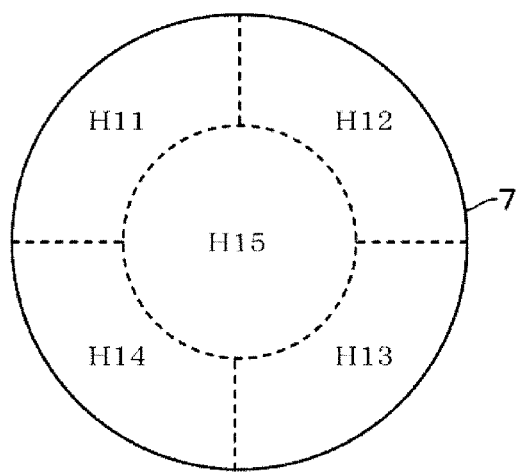
FIGS. 12A and 12B are schematic plan views illustrating the heat plate of the second embodiment of the substrate processing apparatus.
Figure 12B:
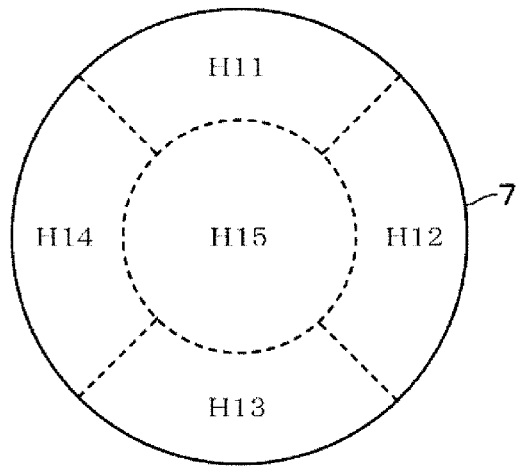
Figure 13:
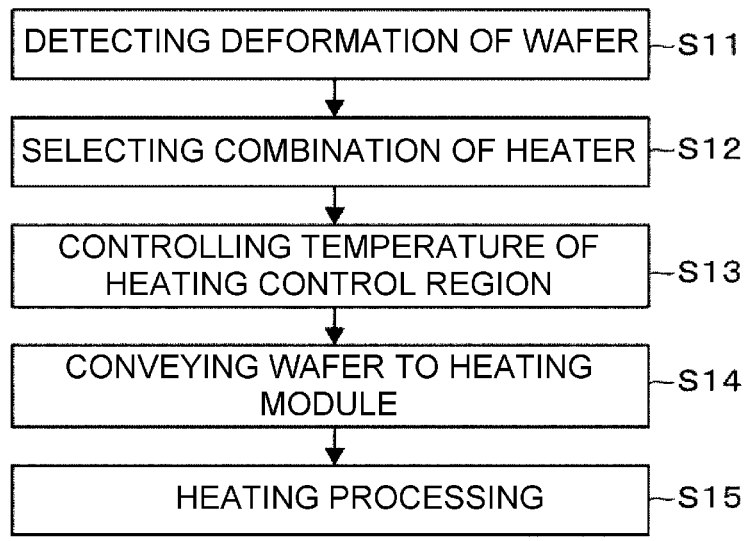
FIG. 13 is a flow chart illustrating a substrate processing method of the second embodiment.

When selecting the first combination, for example, as illustrated in FIG. 12A, the heating control region H11 aligned with the heating zones Z1 and Z8, the heating control region H12 aligned with the heating zones Z2 and Z3, the heating control region H13 aligned with the heating zones Z4 and Z5, and the heating control region H14 aligned with the heating zones Z6 and Z7 are set. When selecting the second combination, for example, as illustrated in FIG. 12B, the heating control region H11 aligned with the heating zones Z1 and Z2, the heating control region H12 aligned with the heating zones Z3 and Z4, the heating control region H13 aligned with the heating zones Z5 and Z6, and the heating control region H14 aligned with the heating zones Z7 and Z8 are set. In FIGS. 12A and 12B, the heating control region H15 by the heating zone Z9 is set as a central region in both cases.

Further, on the heat plate 7, temperature sensors 91 to 95 are provided, for example, between the heating zone Z1 and the heating zone Z2, between the heating zone Z3 and the heating zone Z4, between the heating zone Z5 and the heating zone Z6, between the heating zone Z7 and the heating zone Z7, and in the heating zone Z9, respectively. The temperature sensors 91, 92, 93, 94, and 95 are provided to perform the temperature control of the heating control regions H11, H12, H13, H14, and H15, respectively.

The adjusting unit of this example includes the plurality of heaters 71 to 78 and the switch units 81 to 84 that select a combination of the heaters corresponding to the heating control regions H11 to H14 among the plurality of heaters. The plurality of heaters and the switch units correspond to a mechanism that adjust the arrangement of circumferential direction of the heating control regions H11 to H14 based on the detection result of the deformation of the wafer W. Further, the controller 14 includes an arrangement adjusting unit (not illustrated), instead of the orientation adjusting unit 65 in the first embodiment. The arrangement adjusting unit is configured to output a control signal for adjusting the arrangement of the circumferential of the four heating control regions H11 to H14 to the heating module 11, based on the detection result of the deformation of the wafer W. In this manner, in this example, the detecting module 12 functions as a detecting unit and a distance measuring unit, and the heating module 11 functions as an adjusting unit. Other configurations are the same as those of the first embodiment, and the same components are denoted by the same reference numerals, and the description thereof is omitted.

Subsequently, the heating processing of the wafer W in the example will be described with reference to a flow chart of FIG. 13. First, the wafer W is carried into the detecting module 12 and placed on the holding portion 53. Then, as described above, deformation of the wafer W and a notch position of the wafer W are detected (stage S11). Based on the detection result, the controller 14 outputs a control signal for selecting the combination of heaters 71 to 78 to the heating module 11 as the arrangement adjusting unit (stage S12), and outputs a control signal for adjusting a temperature of each of the heaters 71 to 79 in each of the heating control regions H1 to H5 to the heating module 11 as the temperature adjusting unit 66 (stage S13).

For example, in the arrangement adjusting unit, based on the detection result in FIG. 8, in order to prevent the position P1 in the circumferential direction where the deformation amount is maximum (here, Lmax) from reaching the boundary between the heating control regions, one of the first combination or the second combination is selected for the combination of the heaters, and the switch units 81 to 84 are switched. For example, in this example, a combination of the heaters, for example, whose position P1 is closer to the center line of the heating control region to be arranged is selected.

Meanwhile, in the heating control region (e.g., H11) in which the position P1 of the wafer is arranged, the temperature adjusting unit 66 performs the temperature control by acquiring a correction temperature from the warping amount (Lmax–L0) of the wafer W, based on the correlation data between the temperature and the deformation amount of the wafer. For example, as in the first embodiment, the temperature control of the heaters 71 and 72 is performed by adding the correction temperature obtained from the warping amount to the correction value of the temperature based on the detected value of the temperature sensor 91. In the other heating control regions (e.g., H12 to H15), the temperature control is performed such that the heaters 73 to 79 reach the set temperature by the correction value of the temperature based on the detected value of the temperature sensors 92 to 95. In this example, two heaters provided in the same heating control region are controlled by the corresponding temperature sensors 91 to 94 so as to have the same temperature.

Subsequently, the wafer W is conveyed from the detecting module 12 to the heating module 11 by the conveying module 13, and delivered to the heat plate 7 (stage S14). And then, for example, the heat processing of the wafer W is started in a state where the temperature control of each of the heating control regions H11 to H15 is performed (stage S15). Thereafter, the wafer W on which the heat processing is performed for a predetermined time is conveyed from the heating module 11 to another module (not illustrated) by the conveying module 13.

According to the above embodiment, the relative orientation of the circumferential direction of the wafer W with respect to the heating control regions H11 to H14 is adjusted by adjusting the arrangement of the circumferential direction of the heating control regions H11 to H14 in the heat plate 7, based on the detection result of the deformation of the wafer W. Therefore, as in the first embodiment, even in a case where the wafer W is deformed so that the distance between the wafer and the heat plate surface is not consistent, the region in the wafer W where the deformation amount is large is suppressed from being placed on the boundary between the plurality of heating control regions H11 to H14. Therefore, the uniformity of the heating processing in the plane of the wafer may be improved. Further, since the temperature of the heating control region on which the portion having a large deformation amount of the wafer W is placed is controlled by the correction temperature obtained based on a deformation amount (warping amount) of the peripheral portion region of the corresponding wafer W, excellent in-plane uniformity may be secured for the wafer temperature during the heat processing.

Figure 14:
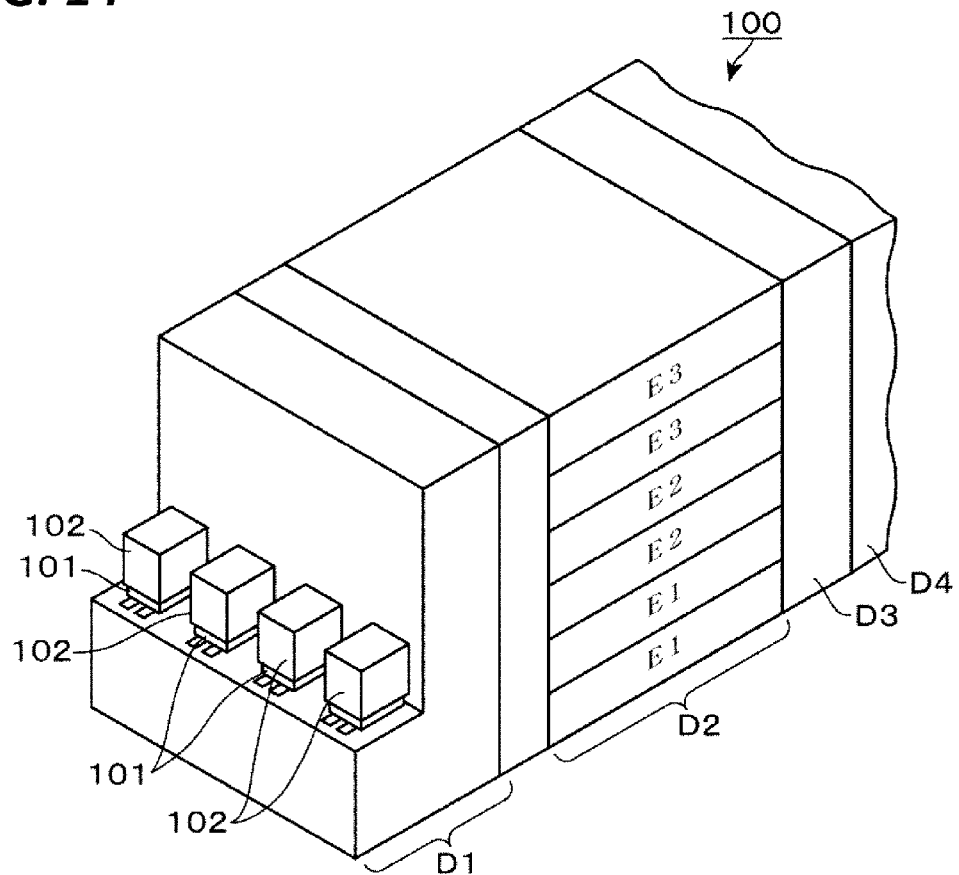
FIG. 14 is a schematic perspective view illustrating a coating and developing apparatus to which a substrate processing apparatus is applied.

Subsequently, an example in which the substrate processing apparatus of the present disclosure is applied to a coating and developing apparatus 100 will be descried with reference to a schematic perspective view of FIG. 14 and a plan view of FIG. 15. The coating and developing apparatus 100 includes a carrier block D1, a processing block D2, an interface block D3, and an exposure apparatus D4. The wafer W is taken out from a carrier 102 placed on a placing portion 101 of the carrier block D1 and delivered to the processing block D2. The processing block D2 includes two set of unit blocks E1, E2, and E3 laminated to each other. The unit block E1 is a block that performs applying a chemical solution for forming an anti-reflective film to the wafer W, and a heating processing for the wafer W after applying the chemical solution, and the unit block E2 is a block that performs applying a resist to the wafer W, and a heating processing for the wafer W after applying the resist. The unit block E3 is a block that performs a heating processing (PEB) after being exposed by the exposure apparatus D4, and a supply of a developing solution to the wafer W after the heating processing.

Each of the blocks D1 to D3 are respectively provided with a conveying mechanism for the wafer W, and the wafer W in the carrier 102 is conveyed in an order of the carrier block D1→the unit block E1→the unit block E2→the interface block D3→the exposure apparatus D4→the interface block D3→the unit block E3, and each processing described above is performed. Thus, the wafer W on which a resist pattern is formed is conveyed to the carrier block D1, and returned back to the carrier 102.

Figure 15:
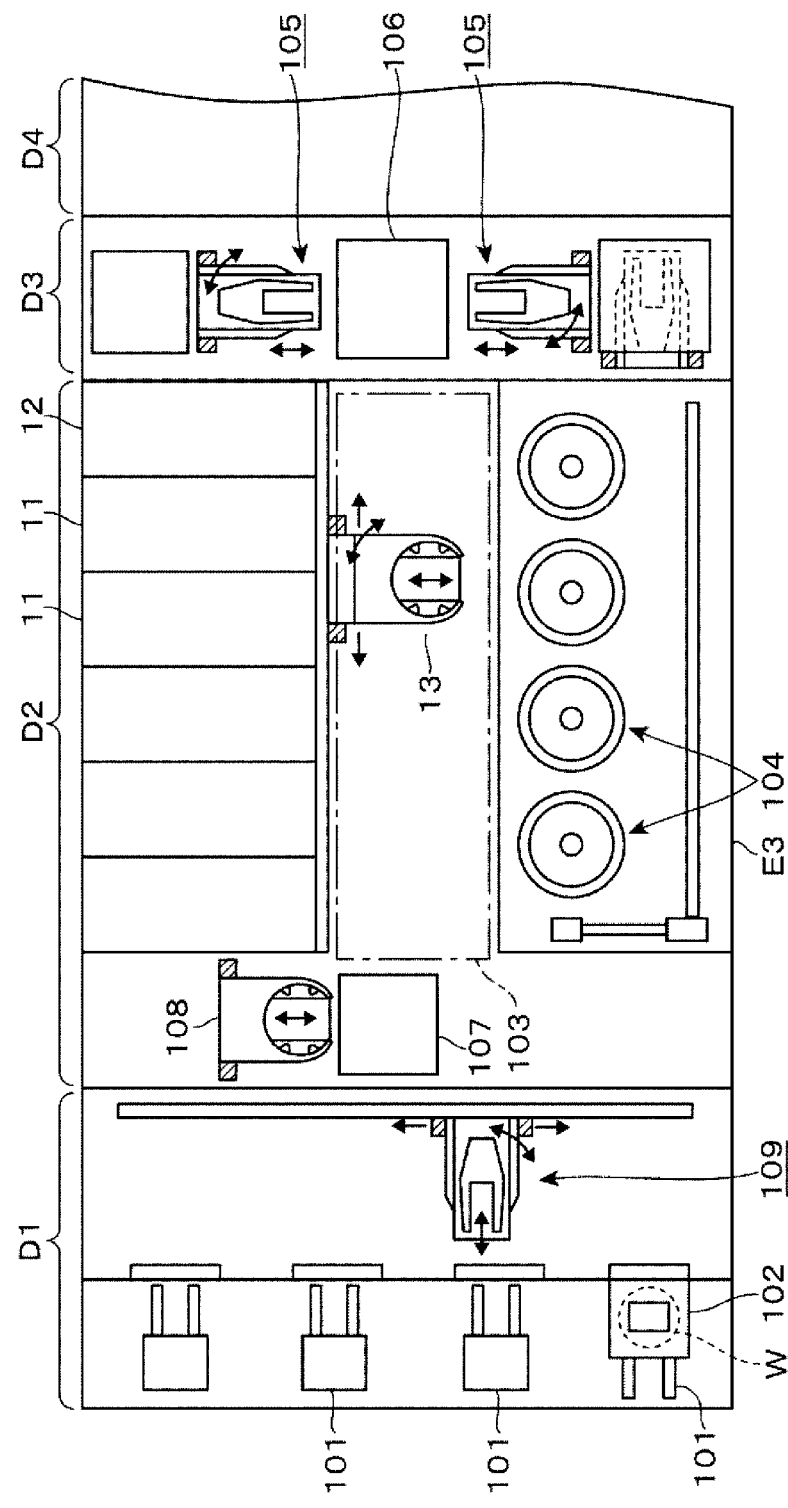
FIG. 15 is a plan view illustrating the coating and developing apparatus.

FIG. 15 is a plan view illustrating the unit block E3. A plurality of modules are arranged in a shelf shape on one side of the left and right sides of a conveying path 103 of the wafer W extending in the front-rear direction. For example, the plurality of heating module 11 of the present disclosure that performs PEB may be provided thereon, and the detecting module 12 of the present disclosure is provided. On the other side of the left and right sides of the conveying path 103, a developing module 104 that supplies a developing solution to the wafer W is provided.

Reference numeral 13 in FIG. 15 denotes a conveying mechanism configured to convey the wafer W between the heating module 11, the detecting module 12, and the interface block D3. The wafer W after being exposed is carried into the processing block D2 via a delivery arm 105 and a delivery module 106 in the interface block D3. Then, the wafer W is conveyed to the detecting module 12 by the conveying mechanism 13, and after detecting deformation of the wafer W, conveyed to one of the plurality of heating modules 11.

Then, based on the detection result of the detecting module 12, a relative orientation of the wafer and a heating control region of the heating module 11 to which the wafer W is conveyed is adjusted, and the temperature control of the heating control region is performed. Subsequently, the wafer W is conveyed to the corresponding heating module 11 from the detecting module 12, and PEB is performed. Thus, in each heating module 11, for example, even if the wafer W is deformed into a saddle-like shape, since the heat processing is performed with excellent uniformity in the plane of the wafer W, uniformity of the resist pattern formed is enhanced. The wafer W after the PEB is conveyed to the developing module 104 by the conveying mechanism 13, and a developing processing is performed. The wafer W after the developing processing is returned back to the carrier block D1 via a delivery module 107 and delivery arms 108 and 109 after heating processing.

The unit block E2 of the above coating and developing apparatus 100 may be configured to include the detecting module 12 and the heating module 11 as the same as the unit block E3, except that a resist applying module is provided instead of the developing module 104. After the deformation of the wafer W to which the resist is applied by the resist applying module is detected by the detecting module 12, and the relative orientation of the wafer W and the heating control region is adjusted based on the detection result. Subsequently, the wafer W is conveyed to the heating module 11 and subjected to the heating processing, and the applied resist is dried so that a resist film is formed. Therefore, even in the case where the wafer W is deformed into, for example, a saddle-like shape, since the resist film may be formed with high uniformity in the plane of the wafer W, CD uniformity in the plane of the wafer W may be improved.

Further, with respect to the unit block E1, the unit block E1 may be configured to be the same as the unit block E3, except that a chemical solution applying module for forming an anti-reflective film is provided instead of the developing module 104. Even in this case, the deformation of the wafer W is detected by the detecting module 12, and the relative orientation of the wafer W and the heating control region is adjusted based on the detection result, and subsequently, the wafer W is conveyed to the heating module 11. Then, a predetermined heating processing is performed.

In the above, the substrate processing apparatus of the present disclosure does not necessarily need to include a detecting unit configured to detect deformation of a substrate different in height with respect to a plane orthogonal to a center axis of the substrate in the circumferential direction. For example, the detecting unit may be provided in a separate apparatus from the substrate processing apparatus, and a relative orientation of the circumferential direction of the substrate and the heating control region may be adjusted in the adjusting unit, using the detection result of the deformation of the substrate detected in the detecting unit. In this case, for example, the controller provided in the substrate processing apparatus acquires information on the deformation of the substrate sent from outside the substrate processing apparatus by online, and based on the information, for example, a control signal is output to an adjusting mechanism configured to adjust the arrangement of the heating control region or the conveying mechanism 13. The information on the deformation of the substrate sent from the outside of the substrate processing apparatus is sent from, for example, the detecting unit that detects the deformation of the substrate, or a separate apparatus that includes the detecting unit, or a host computer. In this example, the controller corresponds to a deformation information acquiring unit that acquires information on deformation of the substrate.

Figure 5:
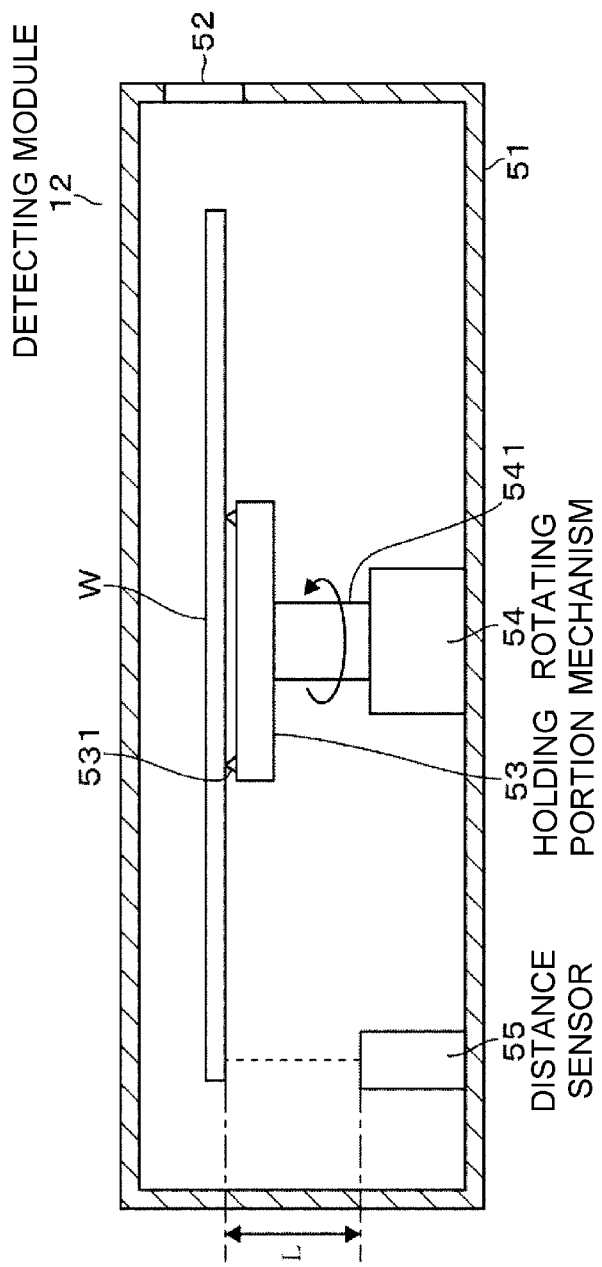
FIG. 5 is a vertical-sectional side view illustrating a detecting module provided in the substrate processing apparatus.
Figure 6:
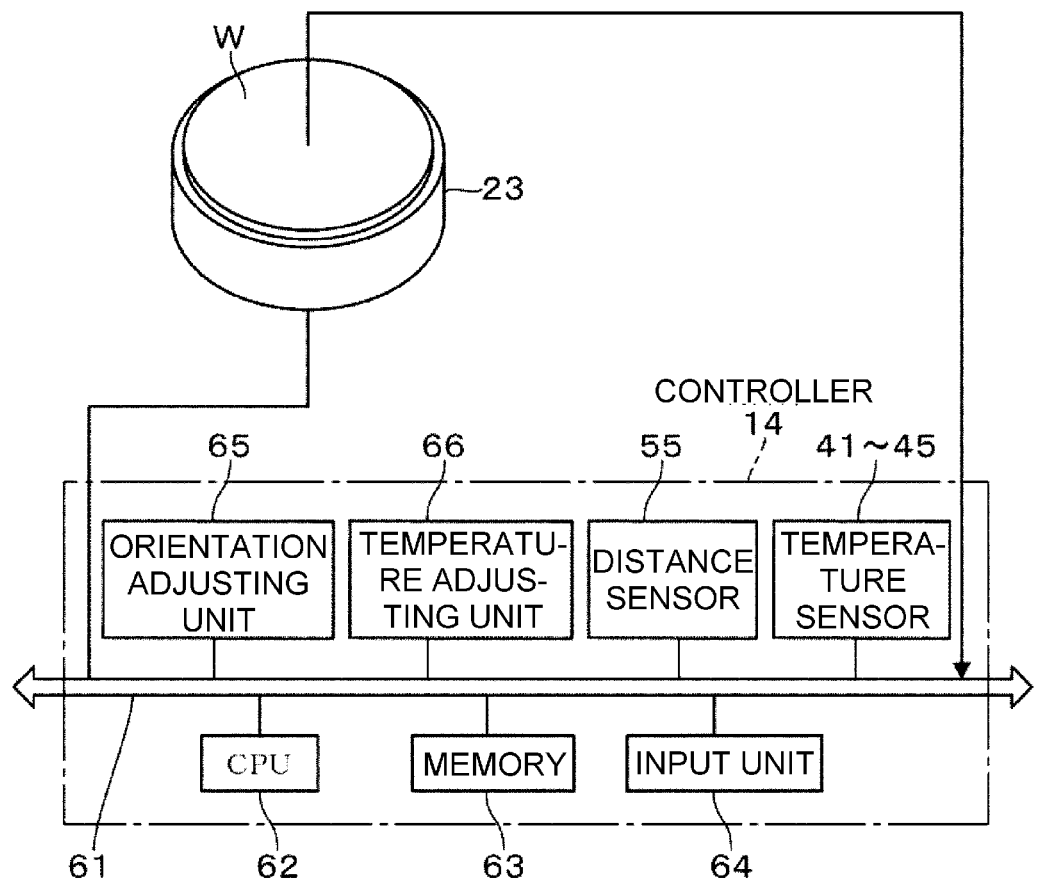
FIG. 6 is a configuration view illustrating a controller provided in the substrate processing apparatus.

In the case where the detecting unit is provided in a separate apparatus from the substrate processing apparatus as described above, in the first embodiment, the detecting module illustrated in FIG. 5 is configured without the distance sensor, and the detecting module is provided as an adjusting unit that adjusts the orientation of the substrate. Further, in the second embodiment, the detecting module illustrated in FIG. 5 does not need to be provided.

Further, the detecting unit is not limited to the configuration illustrated in FIG. 5, and for example, on the upper side of the substrate, a distance sensor that measures a distance to the substrate in a direction orthogonal to the substrate, and is movable in the horizontal direction relatively to the substrate may be provided. For example, the temperature may be controlled by providing the distance sensor to be movable in both longitudinal and horizontal directions relative to the substrate, measuring the distance to the substrate not only in the peripheral portion region of the substrate but also in the central region of the substrate, and obtaining the correction temperature of the heating control region based on the detection result. Further, the warping amount is not limited to the above described example, and may be acquired based on the distance between the heat plate 23 surface and the wafer W, and for example, in FIG.

8, may be acquired from the difference between the distance L and Lmin (the lowest height position of the wafer). In addition, the present disclosure may be applied to a configuration in which the wafer is directly placed on the heat plate surface, instead of placing the wafer on the heat plate through the support pins.

Although a plurality of wafers are stored in a carrier and carried into the substrate processing apparatus, for example, deformation information acquired for a first wafer of a lot forming a group of wafers which is a carrier unit may be applied to a subsequent wafer included the lot.

DESCRIPTION OF SYMBOLS

W: wafer
11: heating module
12: detecting module
13: conveying module
14: controller
23, 7: heat plate
31~35, 71~79: heater
41~45, 91~95: temperature sensor
H1~H5, H11~H15: heating control region
Z1~Z9: heating zone
100: coating and developing apparatus

What is claimed is:

1. A substrate processing apparatus comprising:
a heating chamber including a heat plate having a plurality of heating control regions that are radially arranged around a center of the heat plate to heat a substrate placed on the heat plate, the plurality of heating control regions being independently controlled in temperature;
a detecting chamber including a holder configured to rotate the substrate and a distance sensor configured to measure a first distance to the substrate from a plane orthogonal to a center axis of the substrate at an outer periphery of the substrate; and
a controller configured to control an overall operation of the substrate processing apparatus,
wherein the controller is configured to:
detect a deformation result of the substrate based on the first distance measured by the distance sensor and a second distance measured along the outer periphery of the substrate by rotating the substrate with the holder,
adjust a rotational orientation of the substrate such that a position on the substrate where a deformation amount is maximum is not placed on a boundary between the plurality of heating control regions based on the detected deformation result of the substrate, or perform a selective activation of the plurality of heating control regions based on the detected deformation result of the substrate, and
heat the substrate in a state where the rotational orientation of the substrate is adjusted.

2. The substrate processing apparatus according to claim 1, wherein the heat plate is configured to be heated by a plurality of heaters corresponding the to the plurality of heating control regions.

3. The substrate processing apparatus according to claim 1, wherein the heat plate includes a plurality of heaters corresponding to the plurality of heating control regions, and the controller further includes a switch that selects a combination of the heaters corresponding to the selectively activated plurality of heating control regions.

4. The substrate processing apparatus according to claim 1, wherein the controller outputs a control signal to adjust the rotational orientation of the substrate based on the detected deformation result.

5. A substrate processing method comprising:
detecting a deformation result of a substrate based on a first distance to the substrate measured by a distance sensor from a plane orthogonal to a center axis of the substrate and a second distance measured along an outer periphery of the substrate while rotating the substrate with a holder;
adjusting a rotational orientation of the substrate such that a position on the substrate where a deformation amount is maximum is not placed on a boundary between a plurality of heating control regions that are radially arranged around a center of a heat plate, based on the deformation result obtained in the detecting, the plurality of heating control regions being independently controlled in temperature, or performing a selective activation of the plurality of heating control regions based on the deformation result obtained in the detecting; and
heat the substrate in a state where the rotational orientation of the substrate is adjusted.

6. The substrate processing method according to claim 5, wherein the adjusting the rotational orientation of the substrate is performed before placing the substrate on the heat plate.

7. A non-transitory computer-readable storage medium that stores a computer program that is used for a substrate processing apparatus that places the substrate on the heat plate and performs a heating processing on the substrate, wherein the computer program includes a step group organized to, when executed, causes a computer to execute the substrate processing method of claim 5.

8. A substrate processing apparatus comprising:
a heat plate having a plurality of heating control regions that are radially arranged around a center of the heat plate to heat a substrate placed on the heat plate, the plurality of heating control regions being independently controlled in temperature; and
a controller configured to:
adjust a rotational orientation of the substrate such that a position on the substrate where a deformation amount is maximum is not placed on a boundary between the plurality of heating control regions based on a deformation result of the substrate, and
heat the substrate in a state where the rotational orientation of the substrate is adjusted,
wherein the controller detects the deformation result of the substrate based on a first distance measured to the substrate from a plane orthogonal to a center axis of the substrate and a second distance measured along an outer periphery of the substrate by rotating the substrate.

* * * * *